US012040796B2

(12) United States Patent
Sugiyama

(10) Patent No.: US 12,040,796 B2
(45) Date of Patent: Jul. 16, 2024

(54) PROGRAMMABLE LOGIC CIRCUIT DEVICE AND IMAGE PROCESSING APPARATUS

(71) Applicant: FUJIFILM Business Innovation Corp., Tokyo (JP)

(72) Inventor: Fumiaki Sugiyama, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 512 days.

(21) Appl. No.: 17/314,060

(22) Filed: May 7, 2021

(65) Prior Publication Data

US 2022/0182060 A1 Jun. 9, 2022

(30) Foreign Application Priority Data

Dec. 8, 2020 (JP) ................................. 2020-203673

(51) Int. Cl.
*H03K 19/1776* (2020.01)
*H03K 19/17748* (2020.01)
(Continued)

(52) U.S. Cl.
CPC ... *H03K 19/17748* (2013.01); *H04N 1/00954* (2013.01); *H04N 1/0097* (2013.01); *H04N 1/2307* (2013.01)

(58) Field of Classification Search
CPC ....... H03K 19/17748; H03K 19/17756; H04N 1/00954; H04N 1/0097; H04N 1/2307
See application file for complete search history.

(56) References Cited

U.S. PATENT DOCUMENTS

| 8,975,917 B2 * | 3/2015 | Yoneda ................ H03K 19/173 326/38 |
| 9,503,096 B1 * | 11/2016 | Wang .................. H03K 19/1776 |
| 9,560,164 B2 * | 1/2017 | Shinto ..................... H04L 67/34 |

FOREIGN PATENT DOCUMENTS

| JP | 2011-199639 | 10/2011 |
| JP | 2013-211845 | 10/2013 |
| JP | 6049969 | 12/2016 |

* cited by examiner

Primary Examiner — Kent Yip
(74) Attorney, Agent, or Firm — JCIPRNET

(57) ABSTRACT

A programmable logic circuit device includes: a processor; and plural reconfiguration regions each including a circuit configured by change of connection between elements, wherein the processor is configured to: receive designation of a processing group including a series of plural kinds of processing; acquire management data decided for each processing group, the management data designating plural pieces of reconfiguration data each designating connection between elements in a corresponding one of the plural reconfiguration regions so that the designated processing group is performed; acquire the plural pieces of reconfiguration data designated by the acquired management data; change connection between elements in the plural reconfiguration regions in accordance with the designation by the acquired plural pieces of reconfiguration data; and when connection between elements is changed in accordance with designation by the plural pieces of reconfiguration data, in a case where designation by at least one of the acquired plural pieces of reconfiguration data does not require change of connection in a corresponding one(s) of the plural reconfiguration regions, use same reconfiguration data as that used to connect the elements in the corresponding one(s) of the plural reconfiguration regions.

10 Claims, 7 Drawing Sheets

(51) Int. Cl.
*H04N 1/00* (2006.01)
*H04N 1/23* (2006.01)

FIG. 3

| SEQUENCE PROCESSING ID | RECONFIGURATION DATA ID | | |
|---|---|---|---|
| | READING | IMAGE PROCESSING | WRITING |
| S01 | R01 | G01 | W01 |
| S02 | R02 | G02 | W02 |
| S03 | R03 | G01 | W03 |
| S04 | R03 | G02 | W01 |
| S05 | R01 | G03 | W01 |
| S06 | R01 | G02 | W01 |
| S07 | R02 | G04 | W02 |
| S08 | R02 | G05 | W02 |

PROGRAMMABLE LOGIC CIRCUIT DEVICE AND IMAGE PROCESSING APPARATUS

CROSS-REFERENCE TO RELATED APPLICATIONS

This application is based on and claims priority under 35 USC 119 from Japanese Patent Application No. 2020-203673 filed Dec. 8, 2020.

BACKGROUND

(i) Technical Field

The present disclosure relates to a programmable logic circuit device and an image processing apparatus.

(ii) Related Art

In recent years, programmable logic circuit devices such as field programmable gate arrays (FPGAs) and programmable logic devices (PLDs) are used as trial devices or replacement devices in manufacture of application specific integrated circuits (ASICs) in fields such as a digital circuit device. A programmable logic circuit device can realize a logic function desired by a user by changing connection between elements and rewriting a circuit (hereinafter referred to as reconfiguration). Furthermore, reconfiguration of a circuit in a programmable logic circuit device makes it possible to, for example, easily deal with a specification change and correct a circuit defect.

For example, Japanese Unexamined Patent Application Publication No. 2011-199639 describes plural reconfiguration regions each including a circuit reconfigured by change of connection between elements and shifting to an energy saving mode by selectively reconfiguring these reconfiguration regions based on states of processing performed by the reconfiguration regions.

SUMMARY

Aspects of non-limiting embodiments of the present disclosure relate to, in a circuit in which connection between elements is reconfigured based on reconfiguration data designating connection between elements, reducing a scale of held reconfiguration data as compared with a case where all reconfiguration data for performing a series of processing including data input processing, certain processing on the data, and processing for outputting the data that has been subjected to the certain processing are held.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a programmable logic circuit device including: a processor; and plural reconfiguration regions each including a circuit configured by change of connection between elements, wherein the processor is configured to: receive designation of a processing group including a series of plural kinds of processing; acquire management data decided for each processing group, the management data designating plural pieces of reconfiguration data each designating connection between elements in a corresponding one of the plural reconfiguration regions so that the designated processing group is performed; acquire the plural pieces of reconfiguration data designated by the acquired management data; change connection between elements in the plural reconfiguration regions in accordance with the designation by the acquired plural pieces of reconfiguration data; and when connection between elements is changed in accordance with designation by the plural pieces of reconfiguration data, in a case where designation by at least one of the acquired plural pieces of reconfiguration data does not require change of connection in a corresponding one(s) of the plural reconfiguration regions, use same reconfiguration data as that used to connect the elements in the corresponding one(s) of the plural reconfiguration regions.

BRIEF DESCRIPTION OF THE DRAWINGS

An exemplary embodiment of the present disclosure will be described in detail based on the following figures, wherein:

FIG. 3 illustrates an example of reconfiguration data according to the present exemplary embodiment;

DETAILED DESCRIPTION

Figure 1:
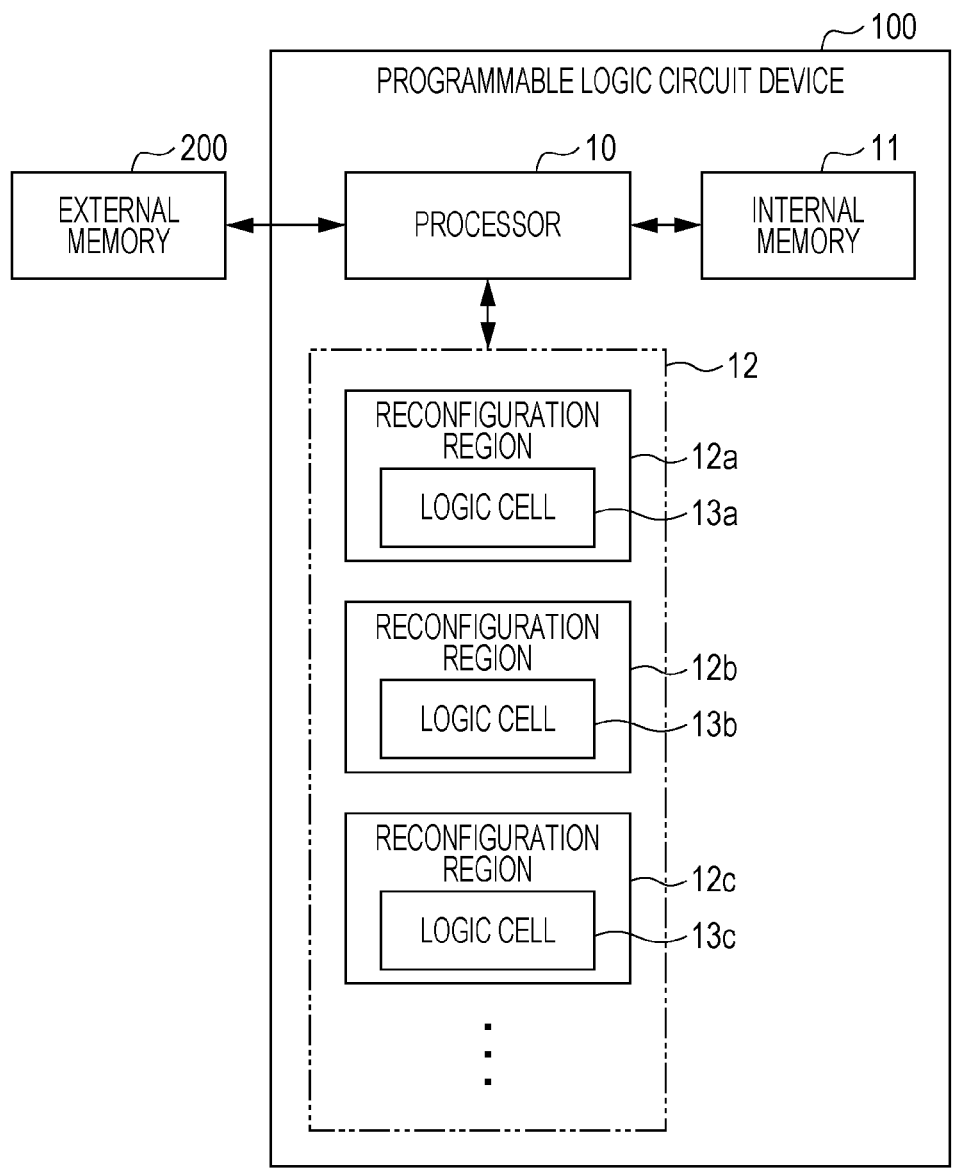
FIG. 1 is a block diagram illustrating an example of a configuration of a programmable logic circuit device according to an exemplary embodiment of the present disclosure.

A configuration of a programmable logic circuit device 100 according to an exemplary embodiment of the present disclosure is described with reference to FIG. 1. The programmable logic circuit device 100 is, for example, a field programmable gate array (FPGA) or a programmable logic device (PLD) and has a processor 10, an internal memory 11, and plural reconfiguration regions 12*a*, 12*b*, 12*c* . . . (hereinafter collectively referred to as reconfiguration regions 12). The processor 10 may include plural processors. The internal memory 11 is, for example, a rewritable memory element such as an electrically erasable and programmable read only memory (EEPROM) or a static random access memory (SRAM). Each of the reconfiguration regions 12 includes corresponding one of logic cells 13*a*, 13*b*, 13*c* . . . (hereinafter collectively referred to as logic cells 13), which are circuits configured by change of connection between elements, and a lookup table (not illustrated) in which reconfiguration data designating connection between elements in the logic cell is written. Hereinafter, rewriting the logic cell 13 by changing connection between elements is referred to as reconfiguration. An external memory 200 is, for example, a rewritable memory element such as an EEPROM or a SRAM.

The processor 10 receives an instruction to perform sequence processing, for example, from an external central processing unit (CPU). The sequence processing is a processing group including a series of plural kinds of processing performed in a preset order. For example, in a case where the programmable logic circuit device 100 is mounted in an image processing apparatus such as a printer, the sequence processing is made up of three kinds of processing: processing for reading data from an outside of the programmable logic circuit device 100, image processing on the read data, and processing for writing the data that has been subjected to the image processing to the outside of the programmable logic circuit device 100. As for the processing for reading data from the outside of the programmable logic circuit device 100 among these kinds of processing, there are plural kinds of reading processing that are different in order of data reading (for example, whether data is read out in a second scanning direction or read out in a first scanning direction). That is, these kinds of reading processing are different in connection between elements in a reconfiguration region 12 for performing the reading processing, and different reconfiguration data are needed for the respective kinds of reading processing accordingly. As for the image processing performed on the read data, there are plural kinds of image processing that are different in processing itself on the data (for example, color conversion processing or filter processing). These kinds of image processing are different in connection between elements in a reconfiguration region 12 for performing the image processing, and different reconfiguration data are needed for the respective kinds of image processing accordingly. As for the processing for writing the data that has been subjected to the image processing, there are plural kinds of writing processing that are different in image rotation or enlargement/reduction or data writing order (for example, whether data is written in a second scanning direction or written in a first scanning direction). Accordingly, these kinds of writing processing are different in connection between elements in a reconfiguration region 12 for performing the writing processing, and different reconfiguration data are needed for these kinds of writing processing accordingly.

Figure 2:
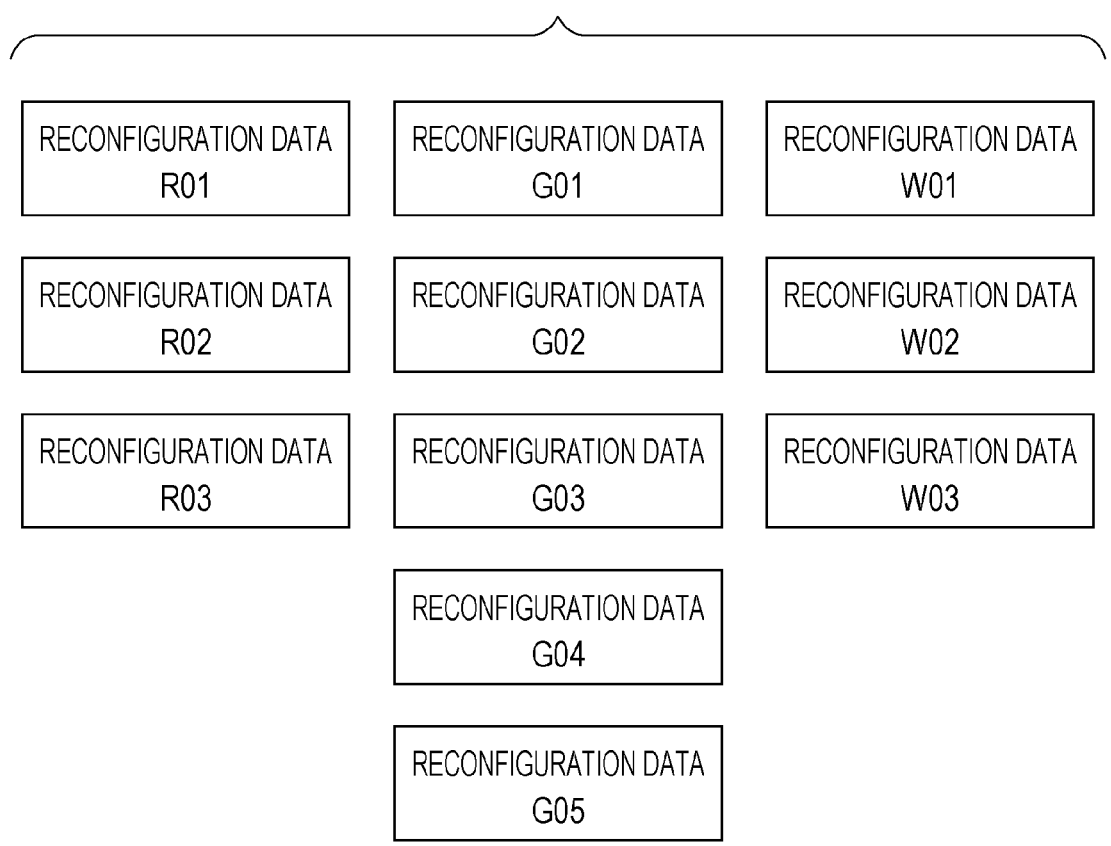
FIG. 2 illustrates an example of management data according to the present exemplary embodiment.

FIG. 2 illustrates an example of reconfiguration data. In the example of FIG. 2, reconfiguration data R01, reconfiguration data R02, and reconfiguration data R03 are reconfiguration data for performing processing for reading data from the outside of the programmable logic circuit device 100. Connections between elements in a logic cell designated by these reconfiguration data are different. Similarly, reconfiguration data G01, reconfiguration data G02, reconfiguration data G03, reconfiguration data G04, and reconfiguration data G05 are reconfiguration data for performing image processing on the read data. Connections between elements in a logic cell designated by these reconfiguration data are different. Similarly, reconfiguration data W01, reconfiguration data W02, and reconfiguration data W03 are reconfiguration data for performing the processing for writing the data that has been subjected to the image processing to the outside of the programmable logic circuit device 100. Connections between elements in a logic cell designated by these reconfiguration data are different. The reconfiguration data illustrated in FIG. 2 are stored in the external memory 200. Accordingly, a storage capacity of the internal memory 11, that is, a circuit scale of the programmable logic circuit device 100 is smaller than that in a case where the reconfiguration data are stored in the internal memory 11.

In the internal memory 11, management data for designating plural reconfiguration data for performing the plural kinds of processing that constitute the sequence processing is stored. FIG. 3 illustrates an example of the management data. In the example of FIG. 3, each of sequence processing IDs "S01" to "S08" is associated with reconfiguration data IDs of plural reconfiguration data designating connection between elements in the logic cell 13 the sequence processing is performed. For example, reconfiguration data given reconfiguration data IDs "R01", "G01", and "W01" are designated as reconfiguration data for performing sequence processing given a sequence processing ID "S01". The reconfiguration data given the reconfiguration data ID "R01" is reconfiguration data for performing processing for reading data from an outside in the sequence processing given the sequence processing ID "S01". The reconfiguration data given the reconfiguration data ID "G01" is reconfiguration data for performing image processing on the read data in the sequence processing given the sequence processing ID "S01". The reconfiguration data given the reconfiguration data ID "W01" is reconfiguration data for performing processing for writing the data that has been subjected to the image processing in the sequence processing given the sequence processing ID "S01". Such management data does not include reconfiguration data themselves (i.e., information on connection between elements) and includes only reconfiguration data IDs, which are identification information of the reconfiguration data. Accordingly, a total data size is smaller than that in a case where the reconfiguration data themselves are included.

Figure 4:
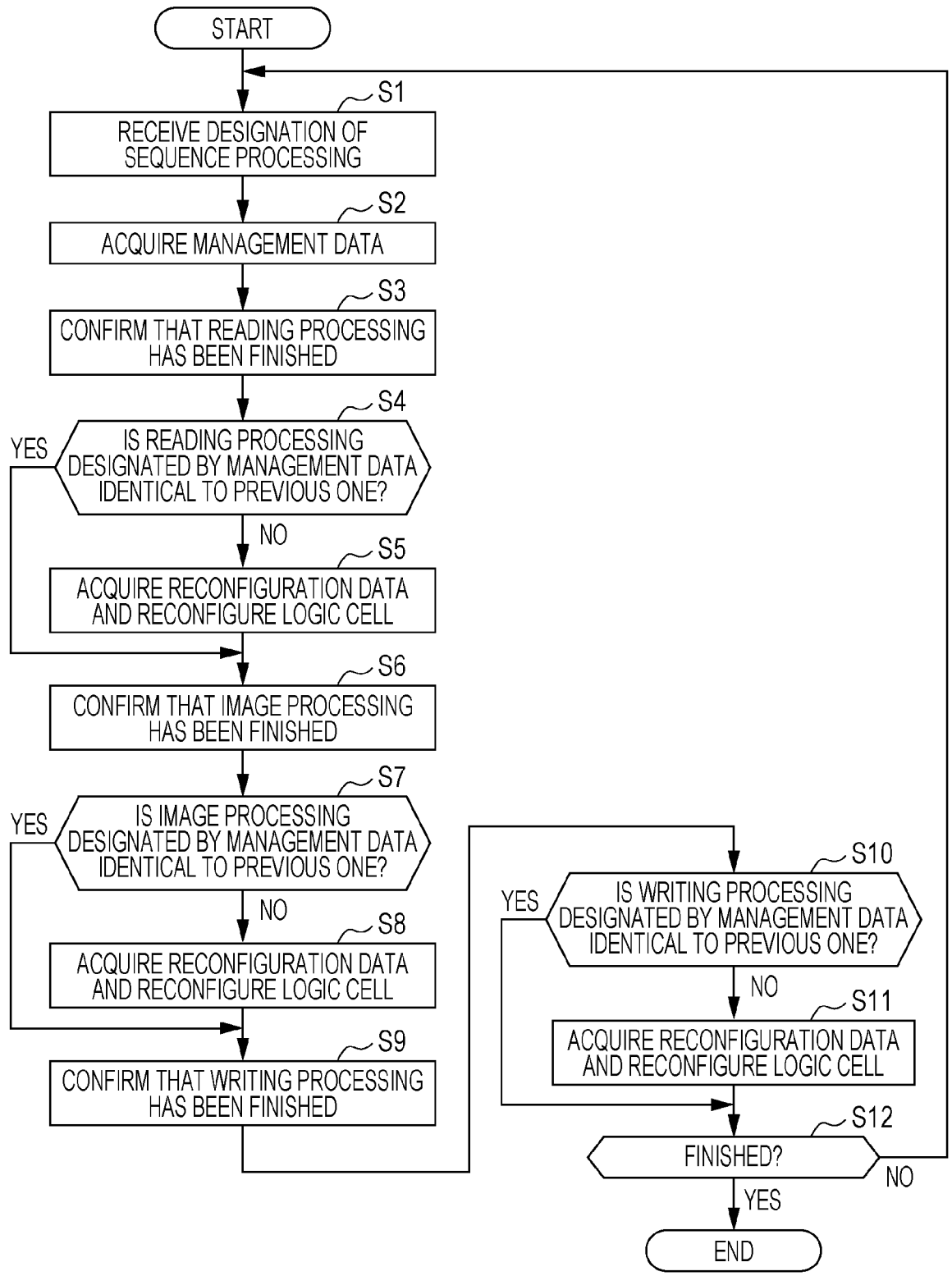
FIG. 4 is a flowchart illustrating operation concerning reconfiguration according to the present exemplary embodiment.

Next, an example of operation of the programmable logic circuit device 100 is described with reference to FIG. 4. In FIG. 4, an external CPU or the like instructs the processor 10 to perform certain sequence processing by designating a sequence processing ID. The processor 10 receives the designation of the sequence processing ID (step S1) and acquires management data corresponding to the sequence processing ID from the internal memory 11 (step S2).

Next, after confirming that data reading processing corresponding to previous sequence processing has been finished (step S3), the processor 10 determines whether or not a reconfiguration data ID of reading processing designated by the acquired management data and a reconfiguration data ID of the data reading processing corresponding to the previous sequence processing are identical (step S4). In a case where the reconfiguration data ID of the reading processing designated by the management data and the reconfiguration data ID of the data reading processing corresponding to the previous sequence processing are not identical (No in step S4), the processor 10 acquires reconfiguration data corresponding to the reconfiguration data ID of the reading processing designated by the management data from the external memory 200 by using this reconfiguration data ID as a key since reconfiguration of a reconfiguration region is necessary. Then, the processor 10 performs reconfiguration in the logic cell 13 of the reconfiguration region 12 based on the acquired reconfiguration data (step S5). Specifically, the processor 10 writes the reconfiguration data into a look-up table in any of the reconfiguration regions. This changes connection between elements in the logic cell in the reconfiguration region with reference to the look-up table. The reconfigured logic cell 13 starts processing for reading data from the outside. In a case where the reconfiguration data ID of the reading processing designated by the management data and the reconfiguration data ID of the reading processing corresponding to the previous sequence processing are identical (Yes in step S4), the processor 10 skips the process in step S5 since reconfiguration of a reconfiguration region is unnecessary.

Next, after confirming that image processing corresponding to the previous sequence processing has been finished (step S6), the processor 10 determines whether or not a reconfiguration data ID of image processing designated by the acquired management data and a reconfiguration data ID of the image processing corresponding to the previous sequence processing are identical (step S7). In a case where the reconfiguration data ID of the image processing designated by the management data and the reconfiguration data ID of the image processing corresponding to the previous sequence processing are not identical (No in step S7), the processor 10 acquires reconfiguration data corresponding to the reconfiguration data ID of the image processing designated by the management data from the external memory 200 by using this reconfiguration data ID as a key. Then, the processor 10 performs reconfiguration in the logic cell 13 of the reconfiguration region 12 based on the acquired reconfiguration data (step S8). The reconfigured logic cell 13 starts image processing on the read data. In a case where the reconfiguration data ID of the image processing designated by the management data and the reconfiguration data ID of the image processing corresponding to the previous sequence processing are identical (Yes in step S7), the processor 10 skips the process in step S8.

Next, after confirming that data writing processing corresponding to the previous sequence processing has been finished (step S9), the processor 10 determines whether or not a reconfiguration data ID of writing processing designated by the acquired management data and a reconfiguration data ID of the data writing processing corresponding to the previous sequence processing are identical (step S10). In a case where the reconfiguration data ID of the writing processing designated by the management data and the reconfiguration data ID of the writing processing corresponding to the previous sequence processing are not identical (No in step S10), the processor 10 acquires reconfiguration data corresponding to the reconfiguration data ID of the writing processing designated by the management data from the external memory 200 by using this reconfiguration data ID as a key. Then, the processor 10 performs reconfiguration in the logic cell 13 of the reconfiguration region 12 based on the acquired reconfiguration data (step S11). The reconfigured logic cell 13 starts processing for writing the data that has been subjected to the image processing after the image processing. In a case where the reconfiguration data ID of the writing processing designated by the management data and the reconfiguration data ID of the writing processing corresponding to the previous sequence processing are identical (Yes in step S10), the processor 10 skips the process in step S11.

When the final writing processing that constitutes the sequence processing is finished (Yes in step S12), the processor 10 finishes the processing illustrated in FIG. 4.

Figure 5:
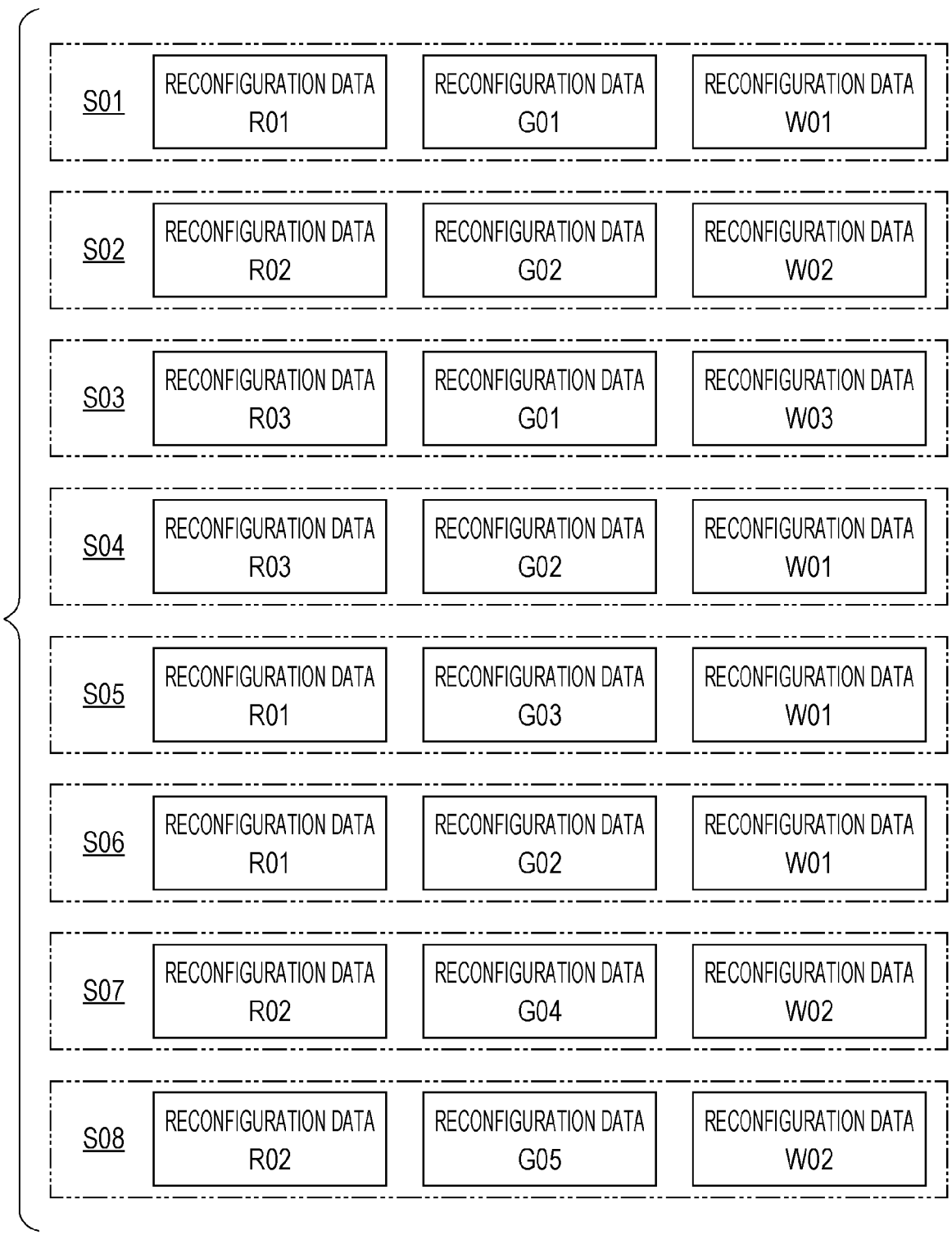
FIG. 5 illustrates an example of reconfiguration data as a comparative example.

FIG. 5 illustrates an example of reconfiguration data as a comparative example. In the example of FIG. 5, for each sequence processing, a combination of reconfiguration data for performing reading processing, image processing, and writing processing that constitute the sequence processing is prepared, and these combinations are stored in a memory corresponding to the internal memory 11 described in the above exemplary embodiment. Accordingly, for example, some reconfiguration data (e.g., reconfiguration data R01) are duplicated in the memory. In contrast, according to the data structure according to the above exemplary embodiment illustrated in FIG. 2, duplicate reconfiguration data are not stored in the memory. Although management data such as the one illustrated in FIG. 3 needs to be stored separately from the reconfiguration data in the above exemplary embodiment, the management data does not include the reconfiguration data themselves and includes only IDs of the reconfiguration data, and therefore a total data size is smaller than that in a case where the reconfiguration data themselves are included, as described above.

Figure 6:
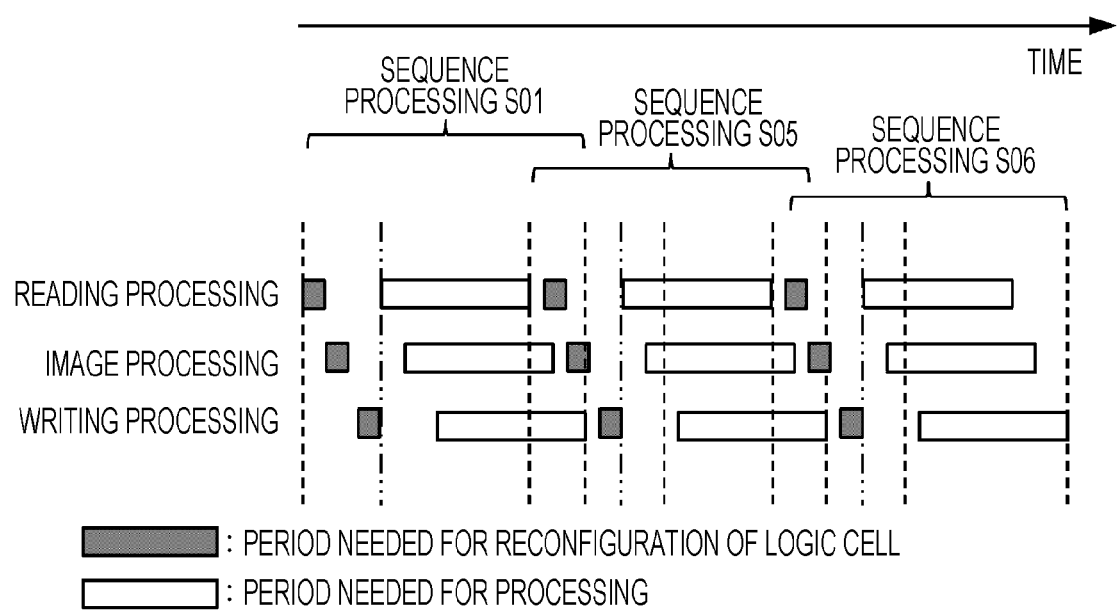
FIG. 6 is a timing diagram illustrating a period needed for operation concerning reconfiguration as a comparative example.
Figure 7:
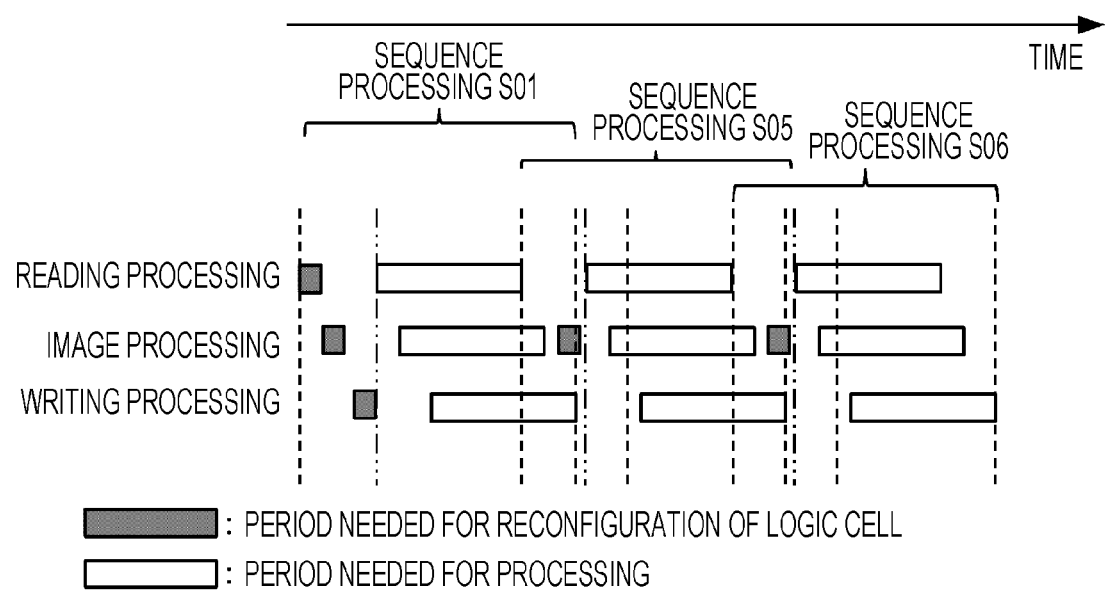
FIG. 7 is a timing diagram illustrating a period needed for operation concerning reconfiguration according to the present exemplary embodiment.

Next, FIG. 6 is a timing diagram illustrating a period needed for operation concerning reconfiguration as a comparative example based on FIG. 5, and FIG. 7 is a timing diagram illustrating a period needed for operation concerning reconfiguration according to the present exemplary embodiment. FIG. 6 illustrates a case where three kinds of sequence processing S01, S05, and S06 are successively performed by three reconfiguration regions, and time proceeds from left to right. When the sequence processing S01 starts, an uppermost reconfiguration region in FIG. 6 performs reconfiguration for performing reading processing that constitutes the sequence processing S01 and starts the reading processing after the reconfiguration. In parallel with this, an intermediate reconfiguration region performs reconfiguration for performing image processing that constitutes the sequence processing S01 and starts the image processing after the reconfiguration. Further in parallel with this, a lowermost reconfiguration region performs reconfiguration for performing writing processing that constitutes the sequence processing S01 and starts the writing processing after the reconfiguration.

After performing the reading processing that constitutes the sequence processing S01, the uppermost reconfiguration region in FIG. 6 performs reconfiguration for performing reading processing that constitutes the sequence processing S05 and starts the reading processing after the reconfiguration. After performing the image processing that constitutes the sequence processing S01, the intermediate reconfiguration region performs reconfiguration for performing image processing that constitutes the sequence processing S05 and starts the image processing after the reconfiguration. After performing the writing processing that constitutes the sequence processing S01, the lowermost reconfiguration region performs reconfiguration for performing writing processing that constitutes the sequence processing S05 and starts the writing processing after the reconfiguration. Similarly, reading processing, image processing, and writing processing that constitute the sequence processing S06 are performed after reconfiguration of the respective reconfiguration regions. In these reconfigurations, whether or not reconfiguration data for performing processing that constitutes sequence processing to be started and reconfiguration data for performing processing that constitutes previous sequence processing are identical is not considered.

Meanwhile, in FIG. 7 illustrating operation according to the present exemplary embodiment, when the sequence processing S01 starts, an uppermost reconfiguration region in FIG. 7 performs reconfiguration for performing reading processing that constitutes the sequence processing S01 and starts the reading processing after the reconfiguration. In parallel with this, an intermediate reconfiguration region performs image processing that constitutes the sequence processing S01 and starts the image processing after the reconfiguration. Further in parallel with this, a lowermost reconfiguration region performs reconfiguration for performing writing processing that constitutes the sequence processing S01 and starts the writing processing after the reconfiguration.

After performing the reading processing that constitutes the sequence processing S01, the uppermost reconfiguration region in FIG. 7 performs reconfiguration for performing reading processing that constitutes the sequence processing S05. However, the uppermost reconfiguration region in FIG.

7 does not perform the reconfiguration since reconfiguration data for the reading processing that constitutes the sequence processing S01 and reconfiguration data for the reading processing that constitutes the sequence processing S05 are identical (see FIG. 3). That is, at this timing, connection between elements is not changed in the uppermost reconfiguration region. Similarly, the uppermost reconfiguration region does not perform reconfiguration since reconfiguration data for the reading processing that constitutes the sequence processing S05 and reconfiguration data for the reading processing that constitutes the sequence processing S06 are identical (see FIG. 3). Furthermore, after performing the writing processing that constitutes the sequence processing S01, the lowermost reconfiguration region performs reconfiguration for performing writing processing that constitutes the sequence processing S05. However, the lowermost reconfiguration region does not perform the reconfiguration since reconfiguration data for the writing processing that constitutes the sequence processing S01 and reconfiguration data for the writing processing that constitutes the sequence processing S05 are identical (see FIG. 3). That is, connection between elements is not changed in the lowermost reconfiguration region in FIG. 7. Similarly, the lowermost reconfiguration region does not perform reconfiguration since reconfiguration data for the writing processing that constitutes the sequence processing S05 and reconfiguration data for writing processing that constitutes the sequence processing S06 are identical (see FIG. 3). As described above, in a case where connection between elements is changed in accordance with designation by reconfiguration data, if designation by at least one reconfiguration data among reconfiguration data for plural kinds of processing that constitutes single sequence processing does not require change of connection between elements in a reconfiguration region, connection between elements is not changed in the reconfiguration region, that is, the same reconfiguration data as that used to connect elements in the reconfiguration region is used. As a result, in FIG. 7, a total period needed to perform the sequence processing S01, S05, and S06 becomes shorter than that in the case of FIG. 6.

Although the exemplary embodiment of the present disclosure has been described in detail above, the present disclosure is not limited to the specific exemplary embodiment and can be modified or changed in various ways within the scope of the present disclosure recited in the claims.

Although the sequence processing is, for example, image processing on image data in the above exemplary embodiment, the sequence processing may be processing other than image processing.

Although the management data is stored in the internal memory 11, the management data may be stored in the external memory 200. Although the reconfiguration data is stored in the external memory 200, the reconfiguration data may be stored in the internal memory 11.

In the embodiments above, the term "processor" refers to hardware in a broad sense. Examples of the processor include general processors (e.g., CPU: Central Processing Unit) and dedicated processors (e.g., GPU: Graphics Processing Unit, ASIC: Application Specific Integrated Circuit, FPGA: Field Programmable Gate Array, and programmable logic device).

In the embodiments above, the term "processor" is broad enough to encompass one processor or plural processors in collaboration which are located physically apart from each other but may work cooperatively. The order of operations of the processor is not limited to one described in the embodiments above, and may be changed.

The foregoing description of the exemplary embodiments of the present disclosure has been provided for the purposes of illustration and description. It is not intended to be exhaustive or to limit the disclosure to the precise forms disclosed. Obviously, many modifications and variations will be apparent to practitioners skilled in the art. The embodiments were chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed is:

1. A programmable logic circuit device comprising:
a processor; and
a plurality of reconfiguration regions each including a circuit configured by change of connection between elements,
wherein
the processor is configured to:
receive designation of a processing group including a series of plural kinds of processing;
acquire management data decided for each processing group, the management data designating a plurality of pieces of reconfiguration data each designating connection between elements in a corresponding one of the plurality of reconfiguration regions so that the designated processing group is performed;
acquire the plurality of pieces of reconfiguration data designated by the acquired management data;
change connection between elements in the plurality of reconfiguration regions in accordance with the designation by the acquired plurality of pieces of reconfiguration data; and
when connection between elements is changed in accordance with designation by the plurality of pieces of reconfiguration data, in a case where designation by at least one of the acquired plurality of pieces of reconfiguration data does not require change of connection in a corresponding one(s) of the plurality of reconfiguration regions, use same reconfiguration data as that used to connect the elements in the corresponding one(s) of the plurality of reconfiguration regions.

2. The programmable logic circuit device according to claim 1, further comprising a memory in which the management data is stored,
the processor is configured to:
acquire the management data from the memory; and
acquire the plurality of pieces of reconfiguration data from an external memory provided outside the programmable logic circuit device.

3. The programmable logic circuit device according to claim 1, wherein
the management data and the reconfiguration data are data concerning reading of data from an outside of the programmable logic circuit device, image processing on the data, and writing of the data that has been subjected to the image processing to the outside of the programmable logic circuit device.

4. The programmable logic circuit device according to claim 2, wherein
the management data and the reconfiguration data are data concerning reading of data from an outside of the programmable logic circuit device, image processing on the data, and writing of the data that has been subjected to the image processing to the outside of the programmable logic circuit device.

5. The programmable logic circuit device according to claim 1, wherein
the processor is configured, in a case where designation by at least one of the acquired plurality of pieces of reconfiguration data does not require change of connection between elements in a corresponding one(s) of the plurality of reconfiguration regions, not to change connection between the elements in the corresponding one(s) of the plurality of reconfiguration regions.

6. The programmable logic circuit device according to claim 2, wherein
the processor is configured, in a case where designation by at least one of the acquired plurality of pieces of reconfiguration data does not require change of connection between elements in a corresponding one(s) of the plurality of reconfiguration regions, not to change connection between the elements in the corresponding one(s) of the plurality of reconfiguration regions.

7. The programmable logic circuit device according to claim 3, wherein
the processor is configured, in a case where designation by at least one of the acquired plurality of pieces of reconfiguration data does not require change of connection between elements in a corresponding one(s) of the plurality of reconfiguration regions, not to change connection between the elements in the corresponding one(s) of the plurality of reconfiguration regions.

8. The programmable logic circuit device according to claim 4, wherein
the processor is configured, in a case where designation by at least one of the acquired plurality of pieces of reconfiguration data does not require change of connection between elements in a corresponding one(s) of the plurality of reconfiguration regions, not to change connection between the elements in the corresponding one(s) of the plurality of reconfiguration regions.

9. An image processing apparatus comprising the programmable logic circuit device according to claim 1.

10. A programmable logic circuit device comprising:
a plurality of reconfiguration regions each including a circuit configured by change of connection between elements;
means for receiving designation of a processing group including a series of plural kinds of processing;
means for acquiring management data decided for each processing group, the management data designating a plurality of pieces of reconfiguration data each designating connection between elements in a corresponding one of the plurality of reconfiguration regions so that the designated processing group is performed;
means for acquiring the plurality of pieces of reconfiguration data designated by the acquired management data;
means for changing connection between elements in the plurality of reconfiguration regions in accordance with the designation by the acquired plurality of pieces of reconfiguration data; and
means for, when connection between elements is changed in accordance with designation by the plurality of pieces of reconfiguration data, in a case where designation by at least one of the acquired plurality of pieces of reconfiguration data does not require change of connection in a corresponding one(s) of the plurality of reconfiguration regions, using same reconfiguration data as that used to connect the elements in the corresponding one(s) of the plurality of reconfiguration regions.

* * * * *